United States Patent [19]

Kuisma

[11] Patent Number: 4,973,923
[45] Date of Patent: Nov. 27, 1990

[54] CIRCUIT ARRANGEMENT FOR THE GENERATION OF I,Q WAVEFORMS

[75] Inventor: Erkki J. Kuisma, Salo, Finland

[73] Assignee: Nokia-Mobira Oy, Salo, Finland

[21] Appl. No.: 365,849

[22] Filed: Jun. 14, 1989

[30] Foreign Application Priority Data

Aug. 19, 1988 [FI] Finland ............................ 883856

[51] Int. Cl.$^5$ ............................................. H03C 3/00
[52] U.S. Cl. .................................... 332/117; 332/119; 455/110
[58] Field of Search ............... 329/302, 306, 307, 309, 329/323, 325, 326, 327, 341, 346; 332/112, 113, 117, 126, 127, 128, 119; 455/42, 110

[56] References Cited

U.S. PATENT DOCUMENTS

| 4,253,067 | 2/1981 | Caples et al. | 329/306 |
| 4,540,958 | 9/1985 | Neyens et al. | 332/128 |
| 4,599,743 | 7/1986 | Reed | 329/325 |

Primary Examiner—Siegfried H. Grimm
Attorney, Agent, or Firm—Darby & Darby

[57] ABSTRACT

In a circuit arrangement for the generation of I,Q waveforms, an incoming analog signal controls a voltage-controlled oscillator (1), whose output signal (U1) is frequency-modulated. This signal (U1) is mixed with unmodulated signals by using mixers that are switches (6,7). The signals controlling the switches are either modulated or oscillator-generated rectangular waves. The circuit arrangement can be implemented as an integrated circuit.

6 Claims, 1 Drawing Sheet

CIRCUIT ARRANGEMENT FOR THE GENERATION OF I,Q WAVEFORMS

BACKGROUND OF THE INVENTION

The present invention relates to a circuit arrangement for the generation of I,Q waveforms. I,Q waveforms (In-phase/Quadrature, i.e. in phase and 90 degrees phase-shifted) are multiplied, for example, into the sin and cos signal forms of a transmission-frequency signal, whereafter the obtained signals are summed. The signal thus obtained is a frequency-modulated signal, for example, a radio-frequency transmission signal. The modulating signals may be analog or digital signals.

The generation of I,Q waveforms from an analog signal is known, for example, from Finnish patent application No. 843 826. The circuitry type represented in that application is shown in the form of a block diagram in FIG. 1. In it, a voltage age $\dot{X}(t)$, i.e. $dx(t)/dt$, corresponding to the incoming signal, is used for controlling a voltage-controlled oscillator 1, the average frequency $f_o$ of which is low compared with the transmission frequency, for example in the order of 100 kHz. The oscillator 1 output $$U = \cos[\omega_o t + k \cdot x(t)],$$

which includes frequency modulation, is divided into two branches, which are multiplied by the sin and cos signal forms of an $f_o$-frequency signal. This $f_o$-frequency signal is unmodulated. The multiples of $f_o$, which are created as a product of mixing, are filtered out of the signals of both branches by means of low-pass filters 4, whereupon the desired sin and cos signal forms are obtained as the result.

SUMMARY OF THE INVENTION

It is the object of the invention to simplify the circuit arrangement of the prior art technique. The characteristics of the invention are given in the claims.

The invention is characterized in that the mixers are implemented using switches which can be controlled by using rectangular waves. Thereby the circuit structure is, in practice, considerably simplified, and it is possible to use, for example, the switched-capacitor or CMOS technique for integrating the whole circuit.

BRIEF DESCRIPTION OF THE DRAWINGS

The invention is described in greater detail with the help of a drawing, in which.

DESCRIPTION OF AN ILLUSTRATIVE EMBODIMENT

Figure 1:
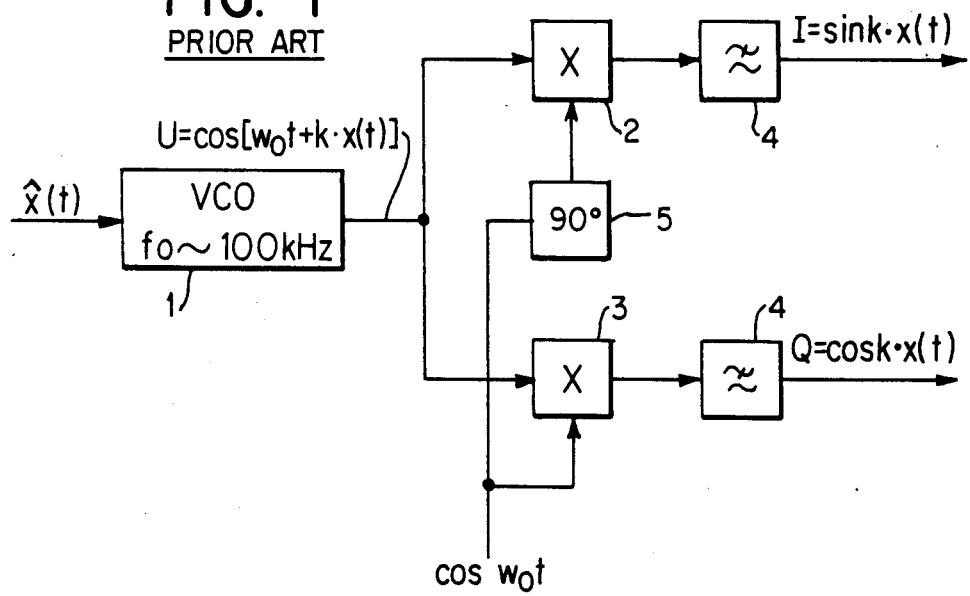
FIG. 1 is a circuit arrangement according to the prior art technique already described.
Figure 2:
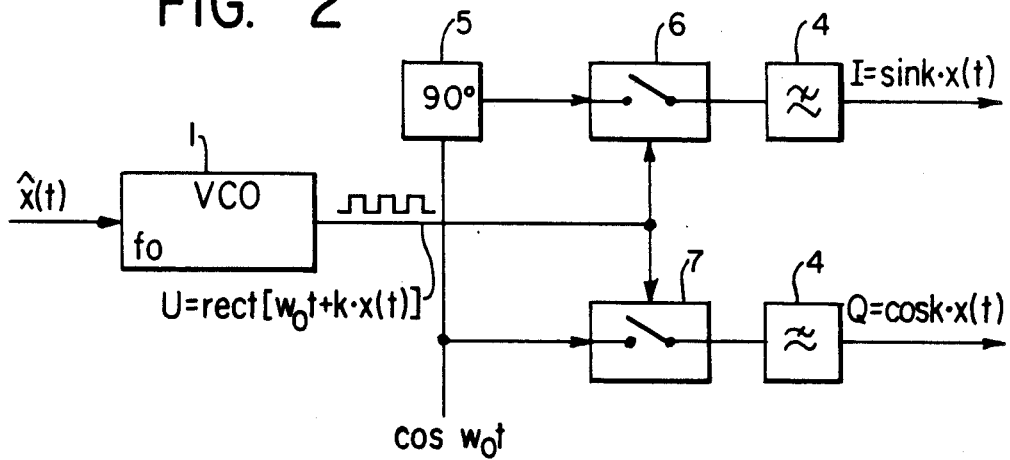
FIG. 2 is a simplified circuit arrangement, according to the invention, for the generation of I,Q waveforms from an analog signal.

The circuit arrangement according to FIG. 1, described above, can be simplified by using, in accordance with the invention, switches 6 and 7 as mixers (FIG. 2). The incoming analog signal x(t) controls a voltage-controlled oscillator 1, the output signal of which $$U1 = \text{rect}[\omega_o t + k \cdot x(t)],$$

i.e. a rectangular wave having an angle frequency of $w_o = 2\pi \cdot f_o$ is frequency-modulated by means of the incoming analog signal. In this embodiment example, the signal U1 is divided into two branches to control the switches 6, 7. By means of the switches the $f_o$-frequency signal is chopped both directly and 90° phase-shifted (by means of phase shifter 5). The signals obtained as the result of the mixing are low-pass filtered by means of filters 4. The I and Q signals obtained as a result can thereafter be treated further.

In another embodiment, not depicted, the output voltage of the oscillator 1 is of the cos form and is divided into two branches, to switches 6, 7. The switches are controlled using $f_o$-frequency rectangular waves, the control signal of one of the switches being 90° phase shifted. By means of this, the advantage is gained that producing a 90° phase shift for a rectangular wave is achieved easily when using digital circuit means. The operation is otherwise as described above.

I claim:

1. A circuit arrangement for the generation of I,Q waveforms from an incoming analog signal x(t), comprising:
   a voltage-controlled oscillator having an input, output, and a means frequency (fo), the analog signal being applied to the input of the voltage-controlled oscillator such that an output signal U1 from the output of the oscillator is frequency-modulated with respect to the mean frequency;
   means for generating two unmodulated signals of the same frequency as the means frequency (fo), said unmodulated signals being separated in phase by 90°, at least one of the output signal U1 and the unmodulated signals having a rectangular shape; and
   first and second switch means for producing a chopped version of an input signal at its output, a control terminal for determining the rate at which a signal on the input is chopped, the output signal U1 being applied to both switch means and the unmodulated signals being applied to respective switch means so as to mix the output signal with the unmodulated signals.

2. A circuit arrangement according to claim 1, wherein the output signal (U1) controls the switch means and is a rectangular wave generated by the voltage-controlled oscillator (1) and the switch means (6, 7), in synchronism with the rectangular wave, chop the unmodulated signals.

3. A circuit arrangement according to claim 1 wherein the unmodulated signals are rectangular waves and the switch means (6,7), in synchronism with the rectangular waves chop the output signal U1.

4. A circuit arrangement according to claim 1, implemented as an integrated circuit.

5. A circuit arrangement according to claim 2, implemented as an integrated circuit.

6. A circuit arrangement according to claim 3, implemented as an integrated circuit.

* * * * *